US012628267B2

(12) United States Patent
Nune et al.

(10) Patent No.: US 12,628,267 B2
(45) Date of Patent: May 12, 2026

(54) MICROELECTRONIC DEVICE PACKAGE ASSEMBLIES INCLUDING STIFFENER DEVICES, AND RELATED MICROELECTRONIC DEVICES AND ELECTRONIC SYSTEMS

(71) Applicant: Micron Technology, Inc., Boise, ID (US)

(72) Inventors: Prasad Nagavenkata Nune, Hyderabad (IN); Christopher Glancey, Boise, ID (US); Yeow Chon Ong, Singapore (SG); Hong Wan Ng, Singapore (SG)

(73) Assignee: Micron Technology, Inc., Boise, ID (US)

( * ) Notice: Subject to any disclaimer, the term of this patent is extended or adjusted under 35 U.S.C. 154(b) by 74 days.

(21) Appl. No.: 18/424,681

(22) Filed: Jan. 26, 2024

(65) Prior Publication Data

US 2024/0292522 A1 Aug. 29, 2024

Related U.S. Application Data

(60) Provisional application No. 63/486,815, filed on Feb. 24, 2023.

(51) Int. Cl.
*H05K 1/02* (2006.01)

(52) U.S. Cl.
CPC . *H05K 1/0271* (2013.01); *H05K 2201/09418* (2013.01); *H05K 2201/10159* (2013.01)

(58) Field of Classification Search
USPC ....................................... 257/678; 361/679.34
See application file for complete search history.

(56) References Cited

U.S. PATENT DOCUMENTS

| | | | | |
|---|---|---|---|---|
| 5,057,023 A | * | 10/1991 | Kabadi | H05K 3/326 |
| | | | | 439/457 |
| 7,161,238 B2 | * | 1/2007 | Hsieh | H01L 23/42 |
| | | | | 257/E23.087 |
| 2002/0114137 A1 | * | 8/2002 | Pearson | H01L 23/4093 |
| | | | | 174/15.2 |

(Continued)

FOREIGN PATENT DOCUMENTS

JP          H07122315 A     *    5/1995

OTHER PUBLICATIONS

Machine Translation for JPH07122315A (Year: 2025).*

*Primary Examiner* — Allen L Parker
*Assistant Examiner* — Peter Krim
(74) *Attorney, Agent, or Firm* — Traskbritt

(57) ABSTRACT

A microelectronic device package assembly includes a package board and a stiffener device attached to the package board. The package board has a first side and a second side. The stiffener device includes an upper stiffener, a lower stiffener, and one or more damper devices. The upper stiffener is above the first side of the package board and has a die side and a package side. The lower stiffener is interposed between the upper stiffener and the package board and has a damper side and a board side. The lower stiffener includes through-package anchors extending from the board side and through the package board. The one or more damper devices are interposed between and are in contact with each of the upper stiffener and the lower stiffener. Microelectronic devices and electronic systems are also described.

20 Claims, 4 Drawing Sheets

(56) References Cited

U.S. PATENT DOCUMENTS

2007/0232090 A1* 10/2007 Colgan ............. H01L 23/49838
257/E23.068
2011/0151687 A1* 6/2011 Mulfinger ............ H05K 7/1492
439/66
2019/0269005 A1* 8/2019 He ...................... H01L 23/4006
2023/0089258 A1* 3/2023 Hoang ................... H05K 7/142
361/787
2023/0299014 A1* 9/2023 Bacha .............. H01L 23/49827
257/737
2023/0309226 A1* 9/2023 Williams ............... H05K 1/145
2024/0126347 A1* 4/2024 Goh ...................... G06F 1/1616

* cited by examiner

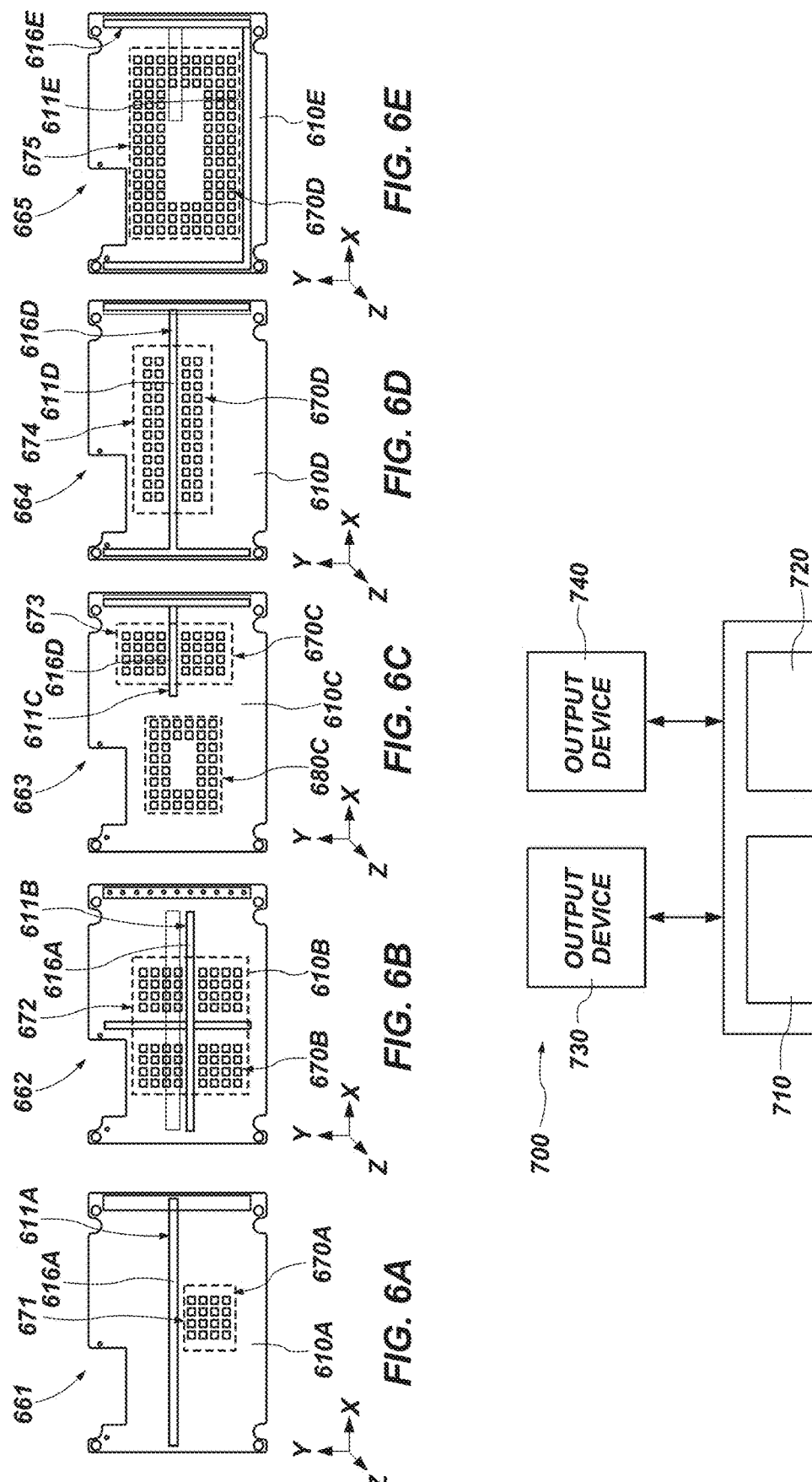

MICROELECTRONIC DEVICE PACKAGE ASSEMBLIES INCLUDING STIFFENER DEVICES, AND RELATED MICROELECTRONIC DEVICES AND ELECTRONIC SYSTEMS

CROSS-REFERENCE TO RELATED APPLICATION

This application claims the benefit under 35 U.S.C. § 119(e) of U.S. Provisional Patent Application Ser. No. 63/486,815, filed Feb. 24, 2023, the disclosure of which is hereby incorporated herein in its entirety by this reference.

TECHNICAL FIELD

The disclosure, in various embodiments, relates generally to the field of printed wiring board design for microelectronic devices. More specifically, the disclosure relates to printed wiring board designs for microelectronic device package assemblies including stiffener devices, a stiffener device including two stiffener structures and dampers between the two stiffener structures, and related to microelectronic devices and electronic systems.

BACKGROUND

Microelectronic memory devices such as solid state memory drives (SSD) often are subject to shock and vibration due to field use on small computing platforms such as smart phones, tablets, and laptop computers. SSDs are provided as plug-into-motherboard substrate devices, motherboard-mounted devices, or package board mounted devices that may couple to motherboards as memory system cards. One type of nonvolatile memory device is a "not and" (NAND) logic based memory device that is mounted on a motherboard or on a package board. Unfortunately, shock and vibration loading on such package boards, particularly in laptop computing devices or some hand-held computing devices, may result in bond pad cratering (losing planarity) because of significant transient stresses under such bond pads during such dynamic loads. Bending deflection of the boards during dynamic loads, may transfer stress under some bond pads and result in cratering.

BRIEF DESCRIPTION OF THE DRAWINGS

FIGS. 6A through 6E illustrate simplified top plan views of different microelectronic device package substrate assemblies including stiffener devices, in accordance with embodiments of the disclosure.

FIG. 7 is a block diagram of an electronic system, in accordance with embodiments of the disclosure.

DETAILED DESCRIPTION

Figures 1A, 1B, 1C:
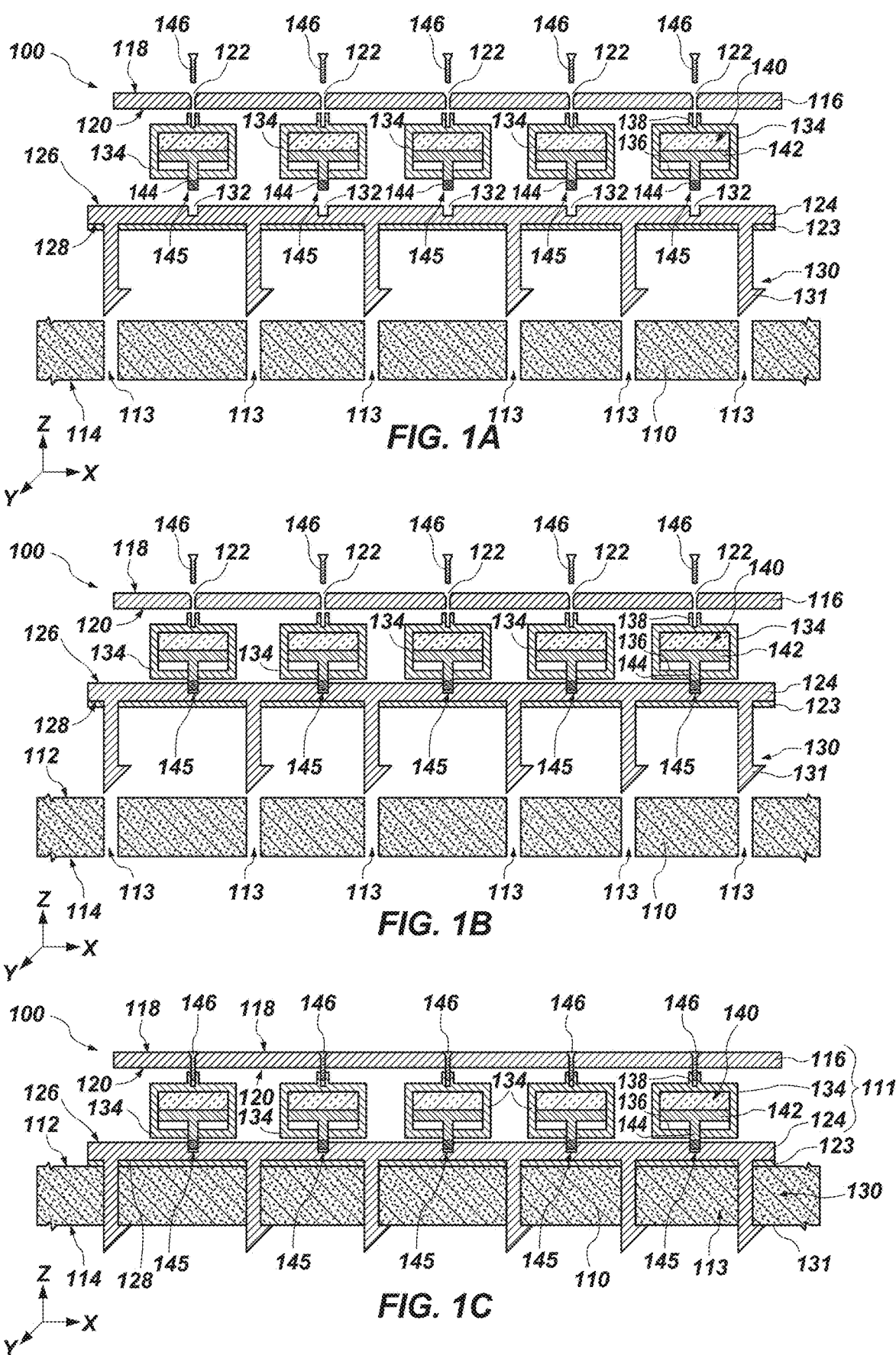
FIGS. 1A through 1C illustrate simplified, transverse cross-section elevation views at different processing stages of a method of forming a microelectronic device package, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round or curved may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory; conventional non-volatile memory), but also includes an application specific integrated circuit (ASIC) (e.g., a system on a chip (SoC)), a microelectronic device combining logic and memory, and a graphics processing unit (GPU) incorporating memory and DRAM Modules.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fc), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_xO_yH_z$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_y$, $SiC_xO_yH_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z"

(if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "semiconductor material" refers to a material having an electrical conductivity between those of insulative materials and conductive materials. For example, a semiconductor material may have an electrical conductivity of between about $10^{-8}$ Siemens per centimeter (S/cm) and about $10^4$ S/cm ($10^6$ S/m) at room temperature. Examples of semiconductor materials include elements found in column IV of the periodic table of elements such as silicon (Si), germanium (Ge), and carbon (C). Other examples of semiconductor materials include compound semiconductor materials such as binary compound semiconductor materials (e.g., gallium arsenide (GaAs)), ternary compound semiconductor materials (e.g., $Al_xGa_{1-x}As$), and quaternary compound semiconductor materials (e.g., $Ga_xIn_{1-X}As_YP_{1-Y}$), without limitation. Compound semiconductor materials may include combinations of elements from columns III and V of the periodic table of elements (III-V semiconductor materials) or from columns II and VI of the periodic table of elements (II-VI semiconductor materials), without limitation. Further examples of semiconductor materials include oxide semiconductor materials such as zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_xGa_ySi_zO$, commonly referred to as "IGSO"), indium tungsten oxide ($In_xW_yO$, commonly referred to as "IWO"), indium oxide ($In_xO$), tin oxide ($Sn_xO$), titanium oxide ($Ti_xO$), zinc oxide nitride ($Zn_xON_z$), magnesium zinc oxide ($Mg_xZn_yO$), zirconium indium zinc oxide ($Zr_xIn_yZn_zO$), hafnium indium zinc oxide ($Hf_{x-}In_yZn_zO$), tin indium zinc oxide ($Sn_xIn_yZn_zO$), aluminum tin indium zinc oxide ($Al_xSn_yIn_zZn_aO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

As used herein, the term "integrated circuit" or "integrated-circuit device" may refer to a "microelectronic device" or a "nanoelectronic device," each of which may be tied to a critical dimension exhibited by inspection. The term "integrated circuit" includes without limitation a memory device, as well as other devices (e.g., semiconductor devices) which may or may not incorporate memory. The term "integrated circuit" may include without limitation a logic device. The term "integrated circuit" may include without limitation a processor device such as a central-processing unit (CPU) or a graphics-processing unit (GPU). The term "integrated circuit" may include without limitation or a radiofrequency (RF) device. Further, an "integrated-circuit" device may incorporate memory in addition to other functions such as, for example, a so-called "system on a chip" (SoC) including a processor and memory, or an integrated-circuit device including logic and memory. Further, an "integrated-circuit" device may incorporate memory in addition to other functions such as, for example, a so-called "disaggregated device" where distinct integrated-circuit components are associated to produce the higher function such as that performed by an SoC, including a processor alone, a memory alone, a processor and a memory, or an integrated-circuit device including logic and memory.

As used herein, the term "substrate" means and includes a material (e.g., a base material) or construction upon which additional materials are formed. The substrate may be a semiconductor substrate. The substrate may be a base semiconductor material on a supporting structure, a metal electrode, or a semiconductor substrate having one or more materials, layers, structures, or regions formed thereon. The materials on the semiconductor substrate may include, but are not limited to, one or more of semiconductor materials, insulating materials, and conductive materials. The substrate may be a conventional silicon substrate or other bulk substrate comprising a layer of semiconductor material. As used herein, the term "bulk substrate" means and includes not only silicon wafers, but also silicon-on-insulator ("SOI") substrates. The "bulk substrate" may be a SOI substrate such as a silicon-on-sapphire ("SOS") substrate. The "bulk substrate" may be a SOI substrate such as a silicon-on-glass ("SOG") substrate. The "bulk substrate" may include epitaxial layers of silicon on a base semiconductor foundation. The "bulk substrate" may include other semiconductor and/or optoelectronic materials. The semiconductor and/or optoelectronic materials may, for example, include one or more of silicon-germanium containing materials, germanium-containing materials, silicon-carbide containing materials, gallium arsenide-containing materials, gallium nitride-containing materials, and indium phosphide-containing materials. The substrate may be doped or undoped.

As used herein, the term "mounting substrate" means and includes structures that are configured to accept an integrated-circuit device. The mounting substrate may be a silicon bridge that is configured to connect more than on integrated-circuit device. The mounting substrate may be a package board that directly contacts an integrated circuit device such as a bare die containing a central-processing unit. The package board may be mounted on a printed wiring board (PWB). The mounting substrate may be a printed wiring board onto which at least one integrated circuit device and/or package board are mounted. The mounting substrate may include a disaggregated device. Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

FIGS. 1A through 1C illustrate simplified, transverse cross-sectional elevation views at different processing stages of a method of forming a microelectronic device package assembly 100, in accordance with embodiments of the disclosure. Referring to FIG. 1A, a microelectronic device package assembly 100 is formed to include, without limitation, a package board 110 having a first side 112, a second side 114, and anchor through-holes 113 vertically extending therethrough. In some embodiments, the package board 110 may be a package board for a solid-state memory drive (SSD), such as a flash memory device. In some embodiments, the package board 110 may be a motherboard of a larger computing system.

At the processing stage of FIG. 1A, the package board 110 is being prepared for assembly with an upper stiffener 116 positioned above the first side 112 of the package board 110. The upper stiffener 116 includes a die side 118, a package side 120, and through holes 122 vertically extending from the die side 118 to the package side 120. In addition, a lower stiffener 124 is positioned between the upper stiffener 116 and the package board 110. The lower stiffener 124 includes a damper side 126 and a board side 128. The designations "upper stiffener" and "lower stiffener" are in relation to the lower stiffener 124 being closer to the package board 110 than is the upper stiffener 116. The upper stiffener 116 and the lower stiffener 124 may be referred to as a first stiffener 116 and a second stiffener 124, respectively. The lower stiffener 124 includes through-package anchors 130 that extend from the board side 128. The through-package anchors 130 are configured and positioned to be inserted through the anchor through-holes 113 of the package board 110, from the first side 112 to the second side 114, as described in further detail below with reference to FIG. 1C. The through-package anchors 130 include flukes 131 that will subsequently contact the second side 114 of the package board 110.

Still referring to FIG. 1A, damper devices 134 are positioned for subsequent assembly between the upper stiffener 116 and the lower stiffener 124. The damper devices 134 include damper enclosures 136 (one occurrence enumerated) surrounding pistons 142 (one occurrence enumerated), wherein the pistons 142 include piston rods 144 extending through floors of the damper enclosures 136. Damper fluid 140 is located within chambers defined by the damper enclosures 136, on one side of the pistons 142. By way of non-limiting example, the damper fluid 140 may be a compressible fluid, such as a gas; or may be a viscous liquid. In some embodiments, the damper fluid 140 is a gas under approximately the same pressure as ambient pressure external to the damper enclosures 136, and the pistons 142 have a sealing fit that substantially contains the damper fluid 140. In additional embodiments, the damper fluid 140 is a gas under greater pressure (overpressure) than the ambient pressure external to the damper enclosures 136. The overpressure may permit the pistons 142 to be readily restored to a previous position after a transient force acts upon them to transiently compress the damper fluid 140. As described in further detail below, the damper devices 134 may subsequently be assembled to the upper stiffener 116 using fasteners 146 to be extended through the through holes 122 of upper stiffener 116 and into top stems 138 (one occurrence enumerated) of the damper devices 134. The top stems 138 may vertically extend from tops of the damper enclosures 136, and may be threaded (e.g., internally threaded, female threaded). In addition, the lower stiffener 124 includes piston rod coupling structures 132 into which the piston rods 144 of the damper devices 134 may subsequently be attached, as described in further detail below with reference to FIG. 1B. In some embodiments, the piston rod coupling structures 132 are internally threaded (e.g., female threaded), and the piston rods 144 externally threaded (e.g., male threaded) at piston rod ends 145.

In additional embodiments, one or more threaded fasteners of the microelectronic device package assembly 100 may be replaced with expansion fasteners. Attention is directed to the upper left corner of FIG. 1A, a damper device 134 may be replaced with a modified damper device. The modified damper device may include an expansion insert top stem in place of the top stem 138 of each damper device 134. The modified damper device may also include an expansion fastener in place of the fastener 146 of each damper device 134. Upon subsequent extension through the upper stiffener 116 and insertion into the expansion insert top stem, the expansion fastener may effectively hold the upper stiffener 116 against the modified damper device. Further, in relation to the modified damper device, the piston rod 144 may be fashioned with an expansion piston rod end, in lieu of the threaded piston rod end 145 of each damper device 134; and the lower stiffener 124 may include a respective expansion-device piston rod coupling structure configured and positioned for receipt of the expansion piston rod end in place of the piston rod coupling structure 132. In some embodiments, threaded connection devices may be used at some portions of the microelectronic device package assembly 100, and expansion connections may be used at some other portions of the microelectronic device package assembly 100. Additional details as to the expansion fasteners, the expansion piston rod ends, and supporting structures, are not provided below with reference to FIGS. 1B and 1C, although they may be used as detailed hereinabove.

FIG. 1B is a simplified, transverse cross-sectional elevation view of the microelectronic device package assembly 100 at a processing stage following the processing stage previously described with reference to FIG. 1A. As shown in FIG. 1B, the damper devices 134 have been attached to the lower stiffener 124. The piston rod ends 145 have been inserted into the piston rod coupling structures 132 (FIG. 1A) of the lower stiffener 124. Where each occurrence of a damper device 134 is threadably coupled to the lower stiffener 124 by way of the piston rod ends 145 and the piston rod coupling structures 132 (FIG. 1A), the damper devices 134 may be attached to the lower stiffener 124 before physically coupling the upper stiffener 116 to the lower stiffener 124 by way of the damper devices 134. Where modified damper devices are used, assembly of the modified damper devices 135 may be first inserted into the expansion-device piston rod coupling structure, followed by assembling the upper stiffener 116 to the modified damper devices. In some embodiments, where a reworking or replacing of the package stiffener device 111 is useful, the flukes 131 may be removed by grinding, and the lower stiffener 124 may be separated from the package board 110.

FIG. 1C is a simplified, transverse cross-sectional elevation view of the microelectronic device package assembly 100 at a processing stage following the processing stage previously described with reference to FIG. 1B. As shown in FIG. 1C, the upper stiffener 116 is attached to the damper devices 134 by way of the fasteners 146 and the top stems 138 of each damper devices 134. Attaching the upper stiffener 116 to the damper devices 134 may effectively attach the upper stiffener 116 to the lower stiffener 124. The combination of the upper stiffener 116, the lower stiffener 124, and the damper devices 134 may be referred to as a package stiffener device 111. In some embodiments, a first supplier provides the damper devices 134, and a second supplier provides the lower stiffener 124. Assembly of the damper devices 134 to the lower stiffener 124 is completed before further assembling either of the upper stiffener 116 to the lower stiffener 124, or of the lower stiffener 124 to the package board 110. As illustrated, the fasteners 146 have been inserted through the upper stiffener 116 and into the top stems 138 of the damper devices 134. Under transient stresses experienced during field use, whether the transient stresses originate onto the package board 110 or onto the upper stiffener 116, the transient stresses are moderated by use of the damper devices 134. Such transient stresses may include shocks and vibrations.

Still referring to FIG. 1C, the through-package anchors 130 of the lower stiffener 124 have also been inserted through the package board 110, such that the flukes 131 have been passed through the anchor through holes 113 (FIGS. 1A and 1B), and physically contact the second side 114. The through-package anchors 130 may be under a tensile stress, and may secure the lower stiffener 124 to the first side 112 of the package board 110.

In some embodiments, an adhesive material 123 (also illustrated in FIGS. 1A and 1B) is located between the first side 112 of the package board 110 and the board side 128 of the lower stiffener 124. A combination of the adhesive material 123 and the through-package anchors 130 may hold the lower stiffener 124 securely against the first side 112 of the package board 110. In additional embodiments, only the adhesive material 123 is employed present to hold the lower stiffener 124 securely against the first side 112 of the package board 110, such that the through-package anchors 130 are omitted (e.g., absent). In further embodiments, only the through-package anchors 130 are employed to hold the lower stiffener 124 securely against the first side 112 of the package board 110, such that the adhesive material 123 is omitted (e.g., absent).

Figures 2, 3:
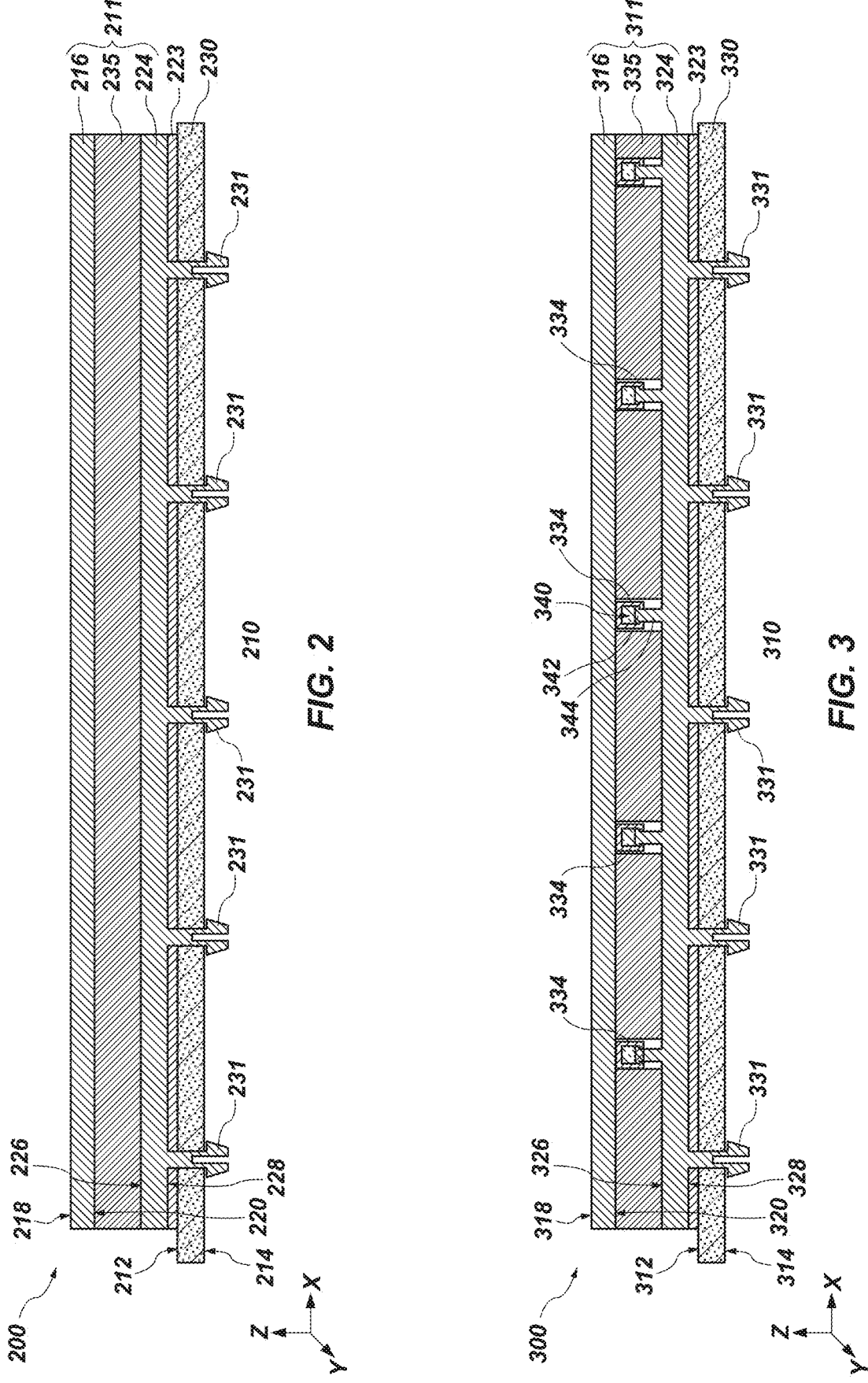
FIG. 2 illustrates a simplified, transverse cross-sectional elevation view of a microelectronic device package, in accordance with embodiments of the disclosure.
FIG. 3 illustrates a simplified, transverse cross-sectional elevation view of a microelectronic device package, in accordance with embodiments of the disclosure.

FIG. 2 is a simplified, transverse cross-sectional elevation view of a microelectronic device package assembly 200, in accordance with additional embodiments of the disclosure. As shown in FIG. 2, the microelectronic device package assembly 200 includes a package board 210 having a first side 212 and a second side 214. The package board 210 is assembled with (e.g., attached to) an upper stiffener 216 positioned above the first side 212 of the package board 210. The upper stiffener 216 includes a die side 218 and a package side 220. A lower stiffener 224 is positioned between the upper stiffener 216 and the package board 210, and includes a damper side 226 and a board side 228. Assembly (e.g., attachment) of the lower stiffener 224 to the package board 210 has been facilitated, at least in part, by way of through-package anchors 230 extending from the board side 228 of the lower stiffener 224. The through-package anchors 230 may be inserted through the package board 210, from the first side 212 to the second side 214. The through-package anchors 230 may include flukes 231 that contact the second side 214 of the package board 210. The through-package anchors 230 may be under tensile stress, and may secure the lower stiffener 224 to the first side 212 of the package board 210.

Still referring to FIG. 2, a damper structure 235 is provided between the upper stiffener 216 and the lower stiffener 224. The damper structure 235 may be a foam structure, such as a reticulated foam structure, or a closed-cell foam structure. Whether a reticulated foam structure or a closed-cell foam structure is employed, a foam material density of the damper structure 235 may be altered to provide useful responses to transient loads that may be imposed upon the microelectronic device package assembly 200. Foam material density may be selected based at least in part on mass per unit volume. Also, whether damper device 236 is a reticulated foam structure or a closed-cell foam structure, foam structure physical properties may be selected to achieve a balance between stiffness and pliability to meet given transient dynamic loading events. In some embodiments, the damper structure 235 comprises a flexible material that may sustain both compression and tension forces, as well as sustain and absorb lateral transient forces. The flexible material may sustain and absorb both compression, tensile, and lateral transient loads. In some embodiments, the damper structure 235 has sufficient adhesive qualities to adhere to each of the upper stiffener 216 and the lower stiffener 224 under expected field-use conditions.

In some embodiments, an adhesive material 223 is located between the first side 212 of the package board 210 and the board side 228 of the lower stiffener 224. A combination of the adhesive material 223 and the through-package anchors 230 may hold the lower stiffener 224 securely against the first side 212 of the package board 210. In additional embodiments, only the adhesive material 223 is used to hold the lower stiffener 224 securely against the first side 212 of the package board 210, such that the through-package anchors 230 are omitted (e.g., absent). In further embodiments, only the through-package anchors 230 are used to hold the lower stiffener 224 securely against the first side 212 of the package board 210, such that the adhesive material 223 is omitted (e.g., absent). When the upper stiffener 216, the lower stiffener 224, and at least one of the damper structure 235 and the adhesive material 223 are assembled as illustrated in FIG. 2, the combination may be referred to as a package stiffener device 211.

FIG. 3 is a simplified, transverse cross-section elevation view of a microelectronic device package assembly 300, in accordance with additional embodiments of the disclosure. As illustrated in FIG. 3, the microelectronic device package assembly 300 includes an upper stiffener 316, a lower stiffener 324, and a combination of a damper structure 335 (e.g., a form damper structure) and damper devices 334 interposed between the upper stiffener 316 and the lower stiffener 324.

The microelectronic device package assembly 300 further includes a package board 310 having a first side 312 and a second side 314. The upper stiffener 316 vertically overlies and is attached to the package board 310. The upper stiffener 316 includes a die side 318 and a package side 320. The damper devices 334 may be integral with the upper stiffener 316. The lower stiffener 324 is between the upper stiffener 316 and the package board 310, and may include a damper side 326 and a board side 328. The lower stiffener 324 may be attached to the package board 310 by way of through-package anchors 330 that extend from the board side 328 of the lower stiffener 324. The through-package anchors 330 may be inserted through the package board 310 from the first side 312 to the second side 314. The through-package anchors 330 may include flukes 331 that contact the second side 314 of the package board 310. The through-package anchors 330 may be under tensile stress, such that the lower stiffener 324 is securely held onto the first side 312 of the package board 310.

Still referring to FIG. 3, the damper structure 335 is between the upper stiffener 216 and the lower stiffener 224. The damper structure 335 may be a foam structure, such as a reticulated foam structure or a closed-cell foam structure.

In some embodiments, the damper structure 335 is a flexible material that may sustain both compression and tension forces. The flexible material may sustain and absorb both compressing and tensile transient loads. In addition, the damper devices 334 may be similar to the damper devices 134 and/or the modified damper devices 135 previously described with reference to FIGS. 1A through 1C. A combination of the damper structure 335 and the damper devices 334 may be used to address and ameliorate transient loads upon the microelectronic device substrate assemblies 300. When the upper stiffener 316, the lower stiffener 324, the damper devices 334, the damper structure 335, and, optionally, an adhesive material 323 (e.g., substantially similar to the adhesive material 223 (FIG. 2)) are assembled as illustrated in FIG. 3, the combination may be referred to as a package stiffener device 311.

Figures 4, 4A, 5:
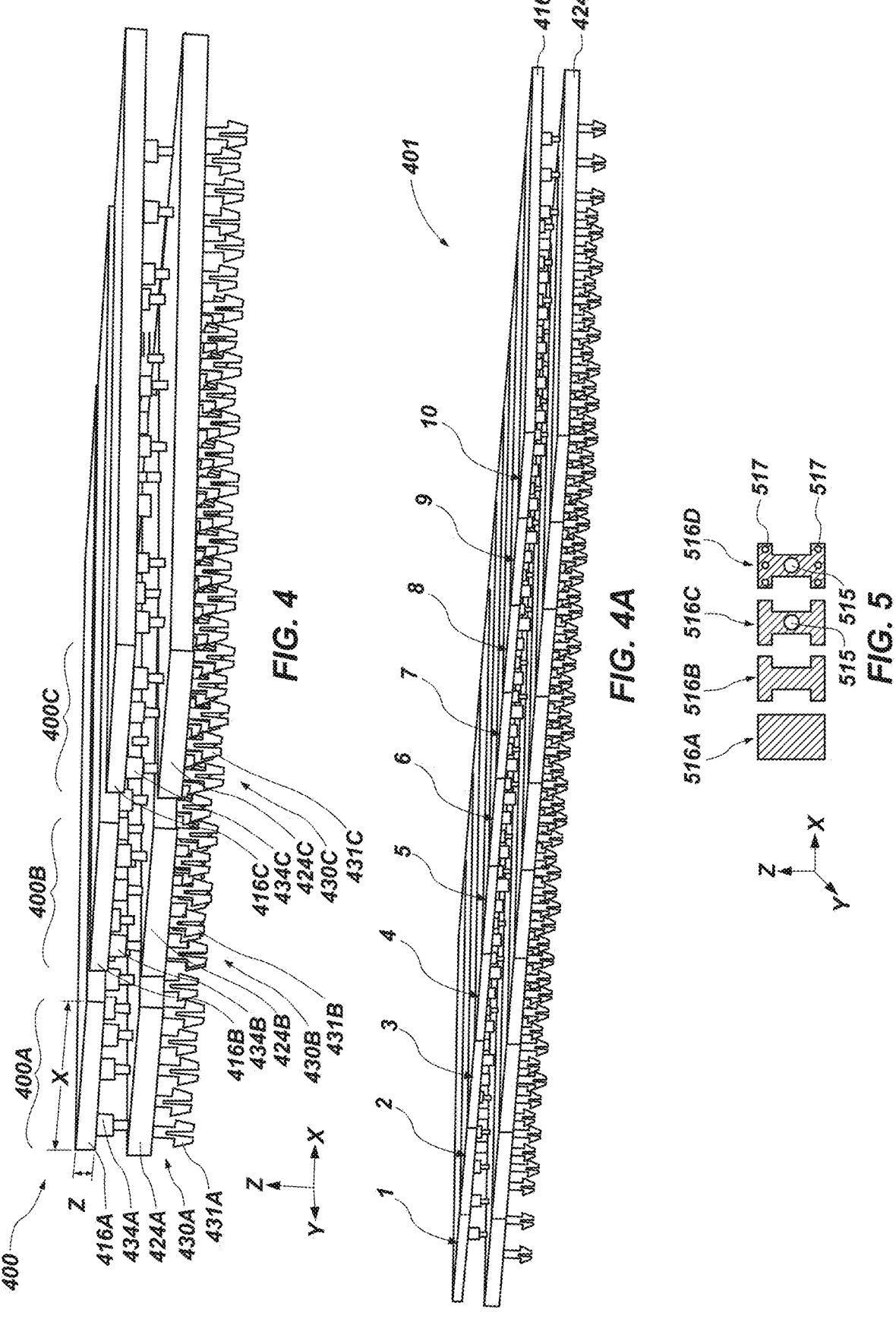
FIGS. 4 and 4A illustrate oblique elevation views of microelectronic package substrate stiffener assemblies, in accordance with several embodiments of the disclosure.
FIG. 5 illustrates a simplified, cross-section elevation view of different upper stiffener structures, in accordance with embodiments of the disclosure.

FIG. 4 is a simplified, oblique elevation view of a microelectronic package substrate stiffener assembly 400, in accordance with embodiments of the disclosure. The microelectronic package substrate stiffener assembly 400 includes a first composite sub-assembly 400A have an upper stiffener 416A, a lower stiffener 424A, and damper devices 434A between the upper stiffener 416A and the lower stiffener 424A. Through-package anchors 430A extend from the lower stiffener 424A, and may include flukes 431A. The microelectronic package substrate stiffener assembly 400 may also include at least one subsequent composite sub-assembly 400B. The first composite sub-assembly 400A and the subsequent composite sub-assembly 400B may horizontally neighbor (e.g., be positioned side-by-side) one another on a given package board (e.g., the package board 110, FIGS. 1A through 1C). In some embodiments, the first composite sub-assembly 400A and the subsequent composite sub-assembly 400B are an integral unit. Where only the first composite sub-assembly 400A is used in a first use, and has an X-Y aspect ratio of a nominal amount of 10:1, a combination of side-by-side deployments of the first composite sub-assembly 400A and the subsequent composite sub-assembly 400B used in a second use, would have an X-Y aspect ratio of 10:2. In some embodiments, the first composite sub-assembly 400A and the subsequent composite sub-assembly 400B are solid plate structures of upper stiffener 416 and lower stiffener 424, where the microelectronic package substrate stiffener assembly 400 has a nominal X-Y aspect ratio of 10:2. In some embodiments, the microelectronic package substrate stiffener assembly 400 further includes a third composite sub-assembly 400C, and the microelectronic package substrate stiffener assembly 400 has a nominal X-Y aspect ratio of 10:3.

FIG. 4A is a simplified, oblique view of a microelectronic package substrate stiffener assembly 401, in accordance with embodiments of the disclosure. The microelectronic package substrate stiffener assembly 401 may have between four (4) and ten (10) composite sub-assemblies (enumerated 1 through 10). The microelectronic package substrate stiffener assembly 401 with ten (10) composite sub-assemblies has an X-Y aspect ratio of 1:1 (10:10) for any given enumerated sub-assembly, compared to where only the first composite sub-assembly 400A (FIG. 4) were present with an X-Y aspect ratio of 10:1 as illustrated in FIG. 4. In some embodiments, between two (2) and ten (10) package stiffener sub-assemblies are used in side-by-side deployment. In some embodiments, between two (2) and ten (10) package stiffener sub-assembly equivalents are provided as an integral unit, where the upper stiffener 416 and the lower stiffener 424 are each a single plate.

FIG. 5 illustrates simplified, cross-sectional elevation views of different upper stiffener structures 516A through 516D that may be employed in microelectronic package substrate stiffener assemblies of the disclosure, in accordance with embodiments of the disclosure. Only one (1) of the upper stiffener structures 516A through 516D may be employed in a given microelectronic package substrate stiffener assembly of the disclosure; or more than one (1) (e.g., two, three, four) of the upper stiffener structures 516A through 516D may be employed, in combination, in given microelectronic package substrate stiffener assembly of the disclosure. A rectangular beam upper stiffener structures 516A may be used, were the rectangular beam upper stiffener 516A has a Z-X aspect ratio of greater than 1. Where height requirements may require a lower aspect ratio, the Z-X aspect ratio may be in a range from 0.1:1 up to and including 2:1. For example, the upper stiffener 416A illustrates an approximate Z-X aspect ratio of 1:8. For each of the following described I-beam stiffeners, each may have a Z-X aspect ratio in a range from 0.1:1 to 2:1. An I-beam upper stiffener 516B may be used, where the I-beam upper stiffener 516B has a Z-X aspect ratio of greater than 1. A central lacuna I-beam upper stiffener 516C may be used, where the central lacuna I-beam upper stiffener 516C includes a central lacuna 515. In some embodiments, extrusion processing may be done to produce any disclosed upper stiffeners, and in the embodiment of the central lacuna I-beam upper stiffener 516C, the central lacuna 515 may reflect the presence of an extrusion die mandrel by which less material is used and extrusion processing is facilitated. In some embodiments, any of the upper stiffeners may be fabricated from extrusion-grade copper or from extrusion-grade aluminum. A central lacuna and top and bottom flange lacunae I-beam upper stiffener 516D may be used, where the central lacuna 515 and the flange-level lacunae 517 may reflect the presence and form factors of extrusion dies. For each of the I-beam upper stiffener embodiments, the aspect ratio may be ascertained by using the Z-height, and the X-width including the flange portions of the given I-beam stiffener. Put another way, for each of the I-beam upper stiffeners 516B through 516D, where height requirements may require a lower aspect ratio, the Z-X aspect ratio may be in a range from 0.2:1 up to and including 2:1.

FIGS. 6A through 6E illustrate simplified top plan views of different microelectronic device (e.g., SSD) package substrate assemblies containing stiffener devices, according to several embodiments. Referring to FIG. 6A, an SSD package substrate assembly 661 includes a package board 610A and a single elongate package stiffener device 611A. The single elongate package stiffener device 611A may substantially linearly extend in the X-direction, and may be positioned at or proximate a horizontal center of the package board 610A in the Y-direction. The single elongate package stiffener device 611A may include an upper stiffener 616A, a lower stiffener, and at least one damper device therebetween. The single elongate package stiffener device 611A may also be referred to as a ribbon form-factor stiffener device 611A. The ribbon form-factor stiffener device 611A may resist bending and flexing out of the Y-Z plane, with greater resistance centrally located at a given Y-position near the ribbon form-factor stiffener structures. In some embodiments, the package board 610A is a substantially rectangular structure when viewed in X-Y dimensions, with a first X-Y aspect ratio, and the stiffener device as a ribbon form-factor stiffener device 611A, has a second X-Y form factor aspect ratio that is higher than the first form factor aspect ratio.

Still referring to FIG. 6A, in some embodiments, an electrical contact array 670A may be located on the package board 610A in a position near the upper stiffener 616A (and lower stiffener and damper device, not illustrated). The electrical contact array 670A, such as an electrical-bump pad array 670A, is illustrated in a nominal 4×4 layout, and it could be any useful layout. In an embodiment, an SSD memory device 671 is provided in footprint outline over the electrical-bump pad array 670A. The electrical contact array 670 may also be referred to as a single rectangular electrical contact array 670A, by comparison to subsequently disclosed electrical contact arrays. In some embodiments, peeling stress during transient loads onto the electrical-bump pad array 670A is reduced by about 30% or more with any disclosed stiffener assembly set forth in the disclosure, compared to a similar transient load without any disclosed stiffener assembly present. Similarly, with respect to transient load stresses imposed within solder bumps that may be located on the electrical-bump pad array 670A, electrical bump stresses are reduced by about 30% or more compared to a similar transient load without any disclosed stiffener assembly present. For subsequently illustrated other embodiments, including electrical contact arrays 670B through 670E of FIGS. 6B through 6E, aspect ratios of any given segment of where more complex deployments of package stiffener devices may have an aspect ratio greater than that if the package board onto which it is mounted.

Referring to FIG. 6B, an SSD package substrate assembly 662 may include a package board 610B and a cross form-factor stiffener device 611B. The cross form-factor stiffener device 611B may include a first portion substantially linearly extending in the X-direction and positioned at or proximate a horizontal center of the package board 610B in the Y-direction; and a second portion substantially linearly extending in the Y-direction and positioned at or proximate a horizontal center of the package board 610B in the X-direction. The first portion may horizontally intersect the second portion. The cross form-factor stiffener device 611B may include an upper stiffener 616B, a lower stiffener, and a damper device therebetween. The SSD package substrate assembly 662 may resist bending and flexing out of the Y-Z plane, with greater resistance centrally located near each portion of the cross form-factor stiffener device 611B. In some embodiments, an electrical contact array 670B is located on the package board 610B in a position near the upper stiffener 616B (and lower stiffener and damper device). The electrical contact array 670B, such as an electrical-bump pad array 670B, is illustrated in a nominal 4× interspaced 4×4 layout that permits electrical bumps to contact the bond pads of the electrical-bump pad array 670B, to hold a given SSD above (Z-direction) the surface of the package board 610B, such that the stiffener assembly is straddled by any mounted SSD device. In an embodiment, an SSD memory device 672 is provided in footprint outline over the electrical-bump pad array 670B. In some embodiments, peeling stress during transient loads onto the contact array 670A is reduced by about 30% with any disclosed stiffener assembly set forth in the disclosure, compared to a similar transient load without any disclosed stiffener assembly present.

Referring to FIG. 6C, an SSD package substrate assembly 663 may include a package board 610C and a T-bar form-factor stiffener device 611C. The T-bar form-factor stiffener device 611C may include a first portion substantially linearly extending in the X-direction across less than or equal to about one-half of the package board 610C, and positioned at or proximate a horizontal center of the package board 610C in the Y-direction; and a second portion substantially linearly extending in the Y-direction and positioned at or proximate a horizontal end of the package board 610C in the X-direction. The first portion may horizontally intersect the second portion. The T-bar form-factor stiffener device 611C may include an upper stiffener 616C, a lower stiffener, and a damper device therebetween. The SSD package substrate assembly 663 may resist bending and flexing out of the X-Y plane, with greater resistance located near each portion of the T-bar form-factor stiffener device 611C. In some embodiments, an electrical contact array 670C may be located on the package board 610C in a position near the upper stiffener 616C (and lower stiffener and damper device, not illustrated). The electrical contact array 670C, such as an electrical-bump pad array 670C, is illustrated in a nominal 2× interspaced 4×4 layout that allows for electrical bumps to contact the bond pads of the electrical-bump pad array 670C, to hold a given SSD above (Z-direction) the surface of the package board 610C, such that the stiffener assembly is straddled by any mounted SSD device. In an embodiment, an SSD memory device 673 is illustrated in footprint outline over the electrical-bump pad array 670C. In some embodiments, a processor device 680C (illustrated in a footprint outline) may also be located on the package board 610C in a computing system. In each of the several embodiments illustrated in FIG. 6, processor devices may be located on the several package boards as required. In some embodiments, an X-portion of the T-bar form-factor stiffener structure may extend substantially edge-to-edge, instead of one portion thereof terminating somewhere before substantially near an edge, as illustrated.

Referring to FIG. 6D, an SSD package substrate assembly 664 may include a package board 610D and an H-bar form-factor stiffener device 611D. The H-bar form-factor stiffener device 611D may include a first portion substantially linearly extending in the X-direction across the package board 610D, and positioned at or proximate a horizontal center of the package board 610D in the Y-direction; and two (2) second portions substantially linearly extending in the Y-direction and positioned at or proximate opposing horizontal ends of the package board 610D in the X-direction. The first portion may horizontally intersect each of the two (2) second portions. The H-bar form-factor stiffener device 611D may include an upper stiffener 616D, a lower stiffener, and a damper device therebetween. The SSD package substrate assembly 664 may resist bending and flexing out of the X-Y plane, with greater resistance located near each portion of the H-bar form-factor stiffener device 611D. In some embodiments, an electrical contact array 670D may be located on the package board 610D in a position near the upper stiffener 616D (and lower stiffener and damper device). The electrical contact array 670D, such as an electrical-bump pad array 670D, is illustrated in a nominal 2× interspaced 2×12 layout that allows for electrical bumps to contact the bond pads of the electrical-bump pad array 670D, to hold a given SSD above (Z-direction) the surface of the package board 610D, such that the stiffener assembly is straddled by any mounted SSD device. In an embodiment, an SSD memory device 674 is illustrated in footprint outline over the electrical-bump pad array 670D.

Referring to FIG. 6E, an SSD package substrate assembly 665 may include a package board 610E and a U-bar form-factor stiffener device 611E. The U-bar form-factor stiffener device 611E may include a first portion substantially linearly extending in the X-direction across the package board 610E, and positioned at or proximate a horizontal end of the package board 610E in the Y-direction; and two (2) second portions substantially linearly extending in the Y-direction and positioned at or proximate opposing horizontal ends of the package board 610E in the X-direction. The first portion may horizontally intersect each of the two (2) second portions. The U-bar form-factor stiffener device 611E may include an upper stiffener 616E, a lower stiffener, and a damper device therebetween. The SSD package substrate assembly 665 may resist bending and flexing out of the X-Y plane, with greater resistance located near each portion of the H-bar form-factor stiffener structures. In some embodiments, an electrical contact array 670E may be located on the package board 610D in a position near the upper stiffener 616E (and lower stiffener and damper device). The electrical contact array 670E, such as an electrical-bump pad array 670E, is illustrated in a nominal inner 3×12 and outer 9×16 outer racetrack layout that allows for electrical bumps to contact the bond pads of the electrical-bump pad array 670E, to hold a given SSD above (Z-direction) the surface of the package board 610E, such that the stiffener assembly is straddled by any mounted SSD device. In an embodiment, an SSD memory device 675 is illustrated in footprint outline over the electrical-bump pad array 670E.

Other stiffener form-factor assemblies may be selected for given SSD package boards, each of which includes an upper stiffener, a lower stiffener, and at least one damper device between them, depending upon a given application. For example, where a hand-held device may include an SSD package substrate assembly, ordinary usage may include incidental unfortunate dropping of the device, where the device may typically impact under conditions that impart a transient dynamic load at a given location such as at a corner, and a SSD package substrate assembly such as the SSD package substrate assembly 665 with the U-bar form-factor stiffener 616E has stiffener assembly structures at each corner of the package board 610E.

Thus, in accordance with embodiments of the disclosure, a microelectronic device package assembly includes a package board and a stiffener device attached to the package board. The package board has a first side and a second side. The stiffener device includes an upper stiffener, a lower stiffener, and a damper device. The upper stiffener is above the first side of the package board and has a die side and a package side. The lower stiffener is interposed between the upper stiffener and the package board and has a damper side and a board side. The lower stiffener includes through-package anchors extending from the board side and through the package board. The damper device is interposed between and is in contact with each of the upper stiffener and the lower stiffener.

Furthermore, in accordance with embodiments of the disclosure, a microelectronic device includes a solid-state drive (SSD) memory device on an electrical contact array of a package board, and a package stiffener device above a first side of the package board. The package stiffener device is horizontally positioned proximate the SSD memory device and includes an upper stiffener, a lower stiffener, and a damper device. The upper stiffener is above the first side of the package board and includes a die side and a package side. The lower stiffener has a damper side and a board side, and includes through-package anchors vertically extending from the board side and completely through the package board. The damper device is vertically interposed between and physically contacts each of the upper stiffener and the lower stiffener.

Microelectronic device package substrate assemblies and structures of the disclosure (e.g., the microelectronic device package assembly 100, the microelectronic device package assembly 200, the microelectronic device package assembly 300, the microelectronic package substrate stiffener assembly 400, the upper stiffener structures 516A through 516D, and the SSD package substrate assemblies 661 through 665) may be employed in embodiments of electronic systems of the disclosure. For example, FIG. 7 is a block diagram of an electronic system 700, according to embodiments of disclosure. The electronic system 700 may comprise, for example, a computer or computer hardware component, a server or other networking hardware component, an SSD, a cellular telephone, a digital camera, a personal digital assistant (PDA), portable media (e.g., music) player, a Wi-Fi or cellular-enabled tablet such as, for example, an iPad® or SURFACE® tablet, an electronic book, or a navigation device, etc. The electronic system 700 includes at least one memory device 720. The memory device 720 may be an SSD and include, for example, one or more of the microelectronic device package substrate assemblies (e.g., the microelectronic device package assembly 100, the microelectronic device package assembly 200, the microelectronic device package assembly 300, the microelectronic package substrate stiffener assembly 400, the upper stiffener structures 516A through 516D, and the SSD package substrate assemblies 661 through 665) of the disclosure. The electronic system 700 may further include at least one electronic signal processor device 710 (often referred to as a "microprocessor") that is part of an integrated circuit. The electronic signal processor device 710 may include, for example, one or more of microelectronic device. While the memory device 720 and the electronic signal processor device 710 are depicted as two (2) separate devices in FIG. 7, in additional embodiments, a single (e.g., only one) memory/processor device having the functionalities of the memory device 720 and the electronic signal processor device 710 is included in the electronic system 700 such as a processor device with an embedded SSD. In such embodiments, the memory/processor device may include, for example, one or more of the microelectronic devices (e.g., the microelectronic device package assembly 100, the microelectronic device package assembly 200, the microelectronic device package assembly 300, the microelectronic package substrate stiffener assembly 400, the upper stiffener structures 516A through 516D, and the SSD package substrate assemblies 661 through 665) of the disclosure. The electronic signal processor device 710 and the memory device 720 may be part of a disaggregated-die assembly 710 and 720 on a package board substrate that may include a stiffener assembly (e.g., the microelectronic device package assembly 100, the microelectronic device package assembly 200, the microelectronic device package assembly 300, the microelectronic package substrate stiffener assembly 400, the upper stiffener structures 516A through 516D, and the SSD package substrate assemblies 661 through 665).

The electronic system 700 may further include one or more input devices 730 for inputting information into the electronic system 700 by a user, such as, for example, a mouse or other pointing device, a keyboard, a touchpad, a button, or a control panel. The electronic system 700 may further include one or more output devices 740 for outputting information (e.g., visual or audio output) to a user such as, for example, a monitor, a display, a printer, an audio output jack, and/or a speaker. In some embodiments, the input device 730 and the output device 740 may comprise a single touchscreen device that can be used both to input information to the electronic system 700 and to output visual information to a user. The input device 730 and the output device 740 may communicate electrically with one or more of the memory device 720 and the electronic signal processor device 710.

Thus, in accordance with embodiments of the disclosure, an electronic system includes an input device, an output device, a processor device operably coupled to the input device and the output device, and a memory device package operably coupled to the processor device. The memory device includes a solid-state drive (SSD) memory device over an electrical contact array of a package board, and a package stiffener device physically attached to the package board. The package stiffener device includes an upper stiffener, a lower stiffener, and a damper device. The lower stiffener is between the upper stiffener and the package board and includes a main body structure, and anchor structures integral with and vertically extending from the main body structure. The anchor structures are physically attached to and vertically extend completely through the package board. The damper device is vertically between and in direct physical contact with each of the upper stiffener and the lower stiffener.

The disclosure advantageously facilitates one or more of improved microelectronic device performance, reduced costs (e.g., manufacturing costs, material costs), increased miniaturization of components, and greater packaging density as compared to conventional structures, conventional devices, conventional systems, and conventional methods. The structures, devices, systems, and methods of the disclosure may also improve scalability, efficiency, and simplicity as compared to conventional structures, conventional devices, conventional systems, and conventional methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents. For example, elements and features disclosed in relation to one embodiment of the disclosure may be combined with elements and features disclosed in relation to other embodiments of the disclosure.

What is claimed is:

1. A microelectronic device package assembly, comprising:
   a package board having a first side and a second side; and
   a stiffener device attached to the package board and comprising:
      an upper stiffener above the first side of the package board and having a die side and a package side;
      a lower stiffener interposed between the upper stiffener and the package board and having a damper side and a board side, the lower stiffener comprising through-package anchors extending from the board side and through the package board; and
      a damper device interposed between and in contact with each of the upper stiffener and the lower stiffener.

2. The microelectronic device package assembly of claim 1, wherein:
   the package board has a rectangular first form factor aspect ratio; and
   the stiffener device has a rectangular second form factor aspect ratio greater than the first form factor aspect ratio.

3. The microelectronic device package assembly of claim 1, wherein the damper device comprises one or more of piston-containing devices and foam structures.

4. The microelectronic device package assembly of claim 1, wherein the damper device comprises one or more of piston-containing devices, each of the piston-containing devices comprising:
   an enclosure;
   top stems extending from a first side of the enclosure;
   a damper fluid within a chamber defined by the enclosure; and
   a piston partially within the chamber and contacting the damper fluid, the piston comprising a piston rod outwardly extending through and beyond the enclosure and having a connector configured to physically connect the piston rod to a coupling structure of the lower stiffener.

5. The microelectronic device package assembly of claim 4, wherein the piston rod comprises a threaded end configured to threadably connect with threading of the coupling structure of the lower stiffener.

6. The microelectronic device package assembly of claim 1, wherein the through-package anchors of the lower stiffener include anchor flukes in physical contact with the second side of the package board.

7. The microelectronic device package assembly of claim 1, further comprising fasteners extending through the upper stiffener and physically connected to top stems extending from the damper devices.

8. The microelectronic device package assembly of claim 7, wherein:
   the top stems comprise one or more of internally threaded top stems and expansion opening top stems; and
   the fasteners comprise one or more of externally threaded fasteners and expansion fasteners.

9. The microelectronic device package assembly of claim 1, further comprising adhesive material interposed between and in physical contact with the lower stiffener and the package board.

10. The microelectronic device package assembly of claim 1, wherein the stiffener device has one of a linear form factor, a cross-shaped form factor, T-bar-shaped form factor, H-bar-shaped form factor and U-bar-shaped form factor.

11. The microelectronic device package assembly of claim 1, further comprising an electrical contact array on the first side of the package board, the electrical contact array comprising one of a single rectangular electrical contact array, interspaced electrical contact sub-arrays neighboring at least a portion of the stiffener device, and a racetrack electrical contact array.

12. A microelectronic device, comprising:
   a solid-state drive (SSD) memory device on an electrical contact array of a package board; and
   a package stiffener device above a first side of the package board, the package stiffener device horizontally positioned proximate the SSD memory device and comprising:
      an upper stiffener above the first side of the package board and including a die side and a package side;
      a lower stiffener including a damper side and a board side, the lower stiffener comprising through-package anchors vertically extending from the board side and completely through the package board; and
      a damper device vertically interposed between and physically contacting each of the upper stiffener and the lower stiffener.

13. The microelectronic device of claim 12, wherein the electrical contact array comprises one of a single rectangular electrical contact array, interspaced electrical contact sub-arrays straddling at least a portion of the package stiffener device, and a racetrack electrical contact array.

14. The microelectronic device of claim 12, wherein the SSD memory device comprises one of a motherboard-mounted device, a package board mounted device, and a memory system card.

15. The microelectronic device of claim 12, wherein the damper device of the package stiffener device is threadably connected to at least one of the upper stiffener and the lower stiffener.

16. The microelectronic device of claim 12, wherein the damper device of the package stiffener device comprises a foam structure.

17. The microelectronic device of claim 12, wherein the damper device of the package stiffener device comprises multiple piston-containing devices physically connected to each of the upper stiffener and the lower stiffener.

18. The microelectronic device of claim 12, wherein the upper stiffener of the package stiffener device has one of a rectangular vertical cross-sectional shape and an I-beam vertical cross-sectional shape.

19. The microelectronic device of claim 18, wherein the upper stiffener of the package stiffener device has the I-beam vertical cross-sectional shape, the I-beam vertical cross-sectional shape exhibiting one or more of a vertically central lacuna, top flange lacunae, and bottom flange lacunae.

20. An electronic system, comprising:

an input device;

an output device;

a processor device operably coupled to the input device and the output device; and a memory device package operably coupled to the processor device, and comprising:

a solid-state drive (SSD) memory device over an electrical contact array of a package board;

a package stiffener device physically attached to the package board and comprising:

an upper stiffener;

a lower stiffener between the upper stiffener and the package board, the lower stiffener comprising:

a main body structure; and anchor structures integral with and vertically extending from the main body structure, the anchor structures physically attached to and vertically extending completely through the package board; and a damper device vertically between and in direct physical contact with each of the upper stiffener and the lower stiffener.

\* \* \* \* \*